United States Patent [19]

Yamamoto et al.

[11] Patent Number: 5,355,390

[45] Date of Patent: Oct. 11, 1994

[54] COMMUNICATION APPARATUS FOR TRANSMITTING AND RECEIVING COMMUNICATION SIGNALS THROUGH COMMON TRANSMISSION LINE

[75] Inventors: Kiyoshi Yamamoto, Toyohashi; Yoshihisa Sato, Kota; Satoshi Suzuki, Nagoya; Masayuki Kobayashi, Anjo, all of Japan

[73] Assignee: Nippondenso Co., Ltd., Kariya, Japan

[21] Appl. No.: 700,698

[22] Filed: May 16, 1991

[30] Foreign Application Priority Data

| May 17, 1990 | [JP] | Japan | 2-127870 |
| Aug. 8, 1990 | [JP] | Japan | 2-211040 |
| Apr. 22, 1991 | [JP] | Japan | 3-090643 |

[51] Int. Cl.$^5$ .................................. H04B 3/00
[52] U.S. Cl. ........................ 375/36; 455/3.1; 370/85.1
[58] Field of Search ............... 455/3.1, 5.1, 6.1, 6.3; 307/263, 270, 350; 375/36; 370/85.1, 85.6, 85.9

[56] References Cited

U.S. PATENT DOCUMENTS

| 3,711,651 | 1/1973 | Connell | 370/78 |
| 4,054,910 | 10/1977 | Chou et al. | 455/3.1 |
| 4,320,521 | 3/1982 | Balakrishnan et al. | 307/263 |
| 4,429,384 | 1/1984 | Kaplinsky | 370/85.1 |
| 4,613,778 | 9/1986 | Raab | 307/350 |
| 4,614,882 | 9/1986 | Parker et al. | 307/263 |
| 4,622,482 | 11/1986 | Ganger | 3.7/263 |
| 4,760,275 | 7/1988 | Sato et al. | 307/10 R |
| 4,890,010 | 12/1989 | Neudeck et al. | 370/85.1 |

FOREIGN PATENT DOCUMENTS

| 0323525 | 7/1989 | European Pat. Off. . |
| 125310 | 4/1977 | Fed. Rep. of Germany . |
| 3941531 | 6/1990 | Fed. Rep. of Germany . |
| 8805979 | 8/1988 | PCT Int'l Appl. . |

*Primary Examiner*—Edward F. Urban
*Attorney, Agent, or Firm*—Cushman, Darby & Cushman

[57] ABSTRACT

A transmitting circuit is provided which includes a control circuit for transmitting and receiving a communication signal. Transmit information is modulated into a trapezoidal wave signal using a waveform shaping circuit. A communication signal is first generated on the basis of the trapezoidal wave signal and transmitted to a first transmission line. From this communication signal, a second communication signal is generated having an inverted polarity waveform shape relative to the first communication signal. This inverted polarity triangular wave signal is, in turn, output from a second transmission line BUS—. In addition, a receiving circuit is provided for receiving like signals from other communication devices which share the first and second transmission lines BUS+ and BUS—. The receiving circuit includes a comparator circuit for demodulating received signals on the transmission lines to generate square wave equivalent signals which a processing unit can logically interpret. Because communication signals are transmitted (received) and derived in the described manner, they are not subject to adverse effects, such as can result from fluctuation of GND potential levels and power supply differences amongst remote communication systems. Furthermore, because an inverted triangular waveform is generated in addition to, and on the basis of, a regular, modulated triangular wave signal, phase shift problems are avoided and radiation of harmonics noise is favorably reduced even at intermediate, or higher, transmission rates.

14 Claims, 6 Drawing Sheets

COMMUNICATION APPARATUS FOR TRANSMITTING AND RECEIVING COMMUNICATION SIGNALS THROUGH COMMON TRANSMISSION LINE

BACKGROUND OF THE INVENTION

1. Field of the Invention

The present invention relates to a communication apparatus and particularly to a communication apparatus suitable for use in a multiplex transmission system in which a plurality of control circuits (hereinafter referred to as ECU) are capable of transmitting and receiving communication signals through a common transmission line.

2. Background Information

A communication signal to be transmitted among ECUs is expressed by a combination of square wave signals. Information is interpreted by comparing a signal received by an ECU with a predetermined threshold value and providing demodulation.

However, such a threshold value is affected by GND voltage differences among ECUs, as well as fluctuations in respective power supply voltages. As a result errors are generated during modulation and demodulation operations. Hence, accurate transmission of communication signals is significantly degraded.

Moreover, because square wave signals rise and fall sharply, a communication signal with combinations of various square wave signals will include a considerable degree of harmonics.

When baseband transmitting through a common transmission line, because the communication signal is a square wave signal, baseband harmonics are radiated and superposed over radio frequency bands, resulting in adverse interference effects on close by devices, such as interference on the reception of radio programs. Consequently, it is essential to take adequate and effective measures against harmonics radiation noise.

As a counter measure, communication signals are not transmitted in square wave form. Instead, the signals are being modulated to a trapezoidal wave shape. The trapezoidal wave signals received by each ECU, are demodulated to the original square wave form, on the basis of a constant threshold value preset in the receiving circuit.

In the above example, spectrum power of harmonic signals is reduced because of trapezoidal wave signals. As a result, the properties of noise radiation is reduced to a very small amount.

However, when compared to a square wave based transmission signal, trapezoidal wave signals have a problem in that errors are generated during modulation and demodulation such as can result from fluctuation in threshold voltage or in communication signal voltage.

In addition, although trapezoidal wave based transmission signals are effective in reducing noise radiation at low transmission rates such as at about 10 kbps at intermediate transmission rates, such as 100 kbps, where a baseband of 50 Khz is common, such signals create problems. When a baseband frequency is very close to an AM radio frequency band (about 500 to 700 Khz) harmonics radiation noise generates adverse effects.

SUMMARY OF THE INVENTION

The inventors of the present invention overcame some of these drawbacks in an early circuit illustrated in FIG. 6.

In this circuit, a square wave signal input to input terminal 1, from transmission Tx, is branched to two routes. Each of two square wave signals is then respectively processed by trapezoidal wave shaping circuits T1, T2.

One signal waveform is converted to an inverse of the other signal and then both transmitted to different transmission lines of a balanced two-wire system, via output terminals 2, 3.

The amplitude of the two signal waveforms is compared using comparator 30, at a receiving side, and the signals demodulated into a square waveform with the purpose of suppressing modulation and demodulation errors as much as possible.

While the circuit of FIG. 6 reduces modulation and demodulation errors, it allows for adverse effects resulting from harmonics radiation at intermediate transmission rates close to 100 kbps.

As a result of further investigation on the circuit explained above, the inventors of the present invention found that because the manner in which each of two trapezoidal wave shaping circuits T1, T2 generates an output to a respective transistor 10, 20 to provide transmission line drive, the inverted triangular waveform cannot be shaped to have an extremely accurate inverse polarity waveform. Such lack of accuracy is due to fluctuations of several tens of percent in resistance and capacitance values within ICs, in light of IC structure employment of circuits, particularly adjustment-free circuit design. As a result, the influences of phase shift and time delay cause waveform transition which increase to a value which cannot be neglected as transmission rate increases leading to harmonics noise radiation.

The inventors determined that harmonics noise is cancelled and the influence of noise radiation is suppressed by the adoption of a balanced two-wire transmission and system. During transmission one of two output waveforms having an extremely accurate inverse polarity output relative to the other is generated, the currents of which signals are the same in amplitude but inverted in direction.

It was also discovered that when one output waveform is transmitted, having an extremely accurate inverse polarity output, in a balanced two-wire transmission system, the radiation of harmonics noise is suppressed even when a square wave signal is not modulated into a trapezoidal wave signal.

It is therefore an object of the present invention to keep modulation and demodulation errors at a minimum without fault from fluctuations of GND potential differences between ECUs, or from power supply voltage differences as well as to suppress the influence of harmonics noise radiation at intermediate and higher transmission rates.

In order to achieve such object, the present invention discloses a communication apparatus for transmitting and receiving communication signals by connecting, with the common transmission line, a first control circuit providing at least a transmitting circuit and a second control circuit providing at least a receiving circuit, wherein the common transmission line is formed by first and second transmission lines.

The transmitting circuit includes a first transmitting means for converting transmitting information into a common signal to be transmitted to a first transmission line and a second transmitting means for inputting the communication signal converted by the first transmitting means and generating, based on this input signal, an inverse polarity signal of the communication signal sent from the first transmission line. In turn, such inverse polarity signal is transmitted to the second transmission line.

The receiving circuit includes a receiving means for comparing amplitudes of the communication signal with the inverse polarity signal transmitted from the transmitting circuit through the first and second transmission lines, and demodulating the transmitting signal.

DETAILED DESCRIPTION OF THE PREFERRED EMBODIMENTS

The present invention is explained with reference to the preferred embodiments shown in the accompanying drawings.

Figure 1:
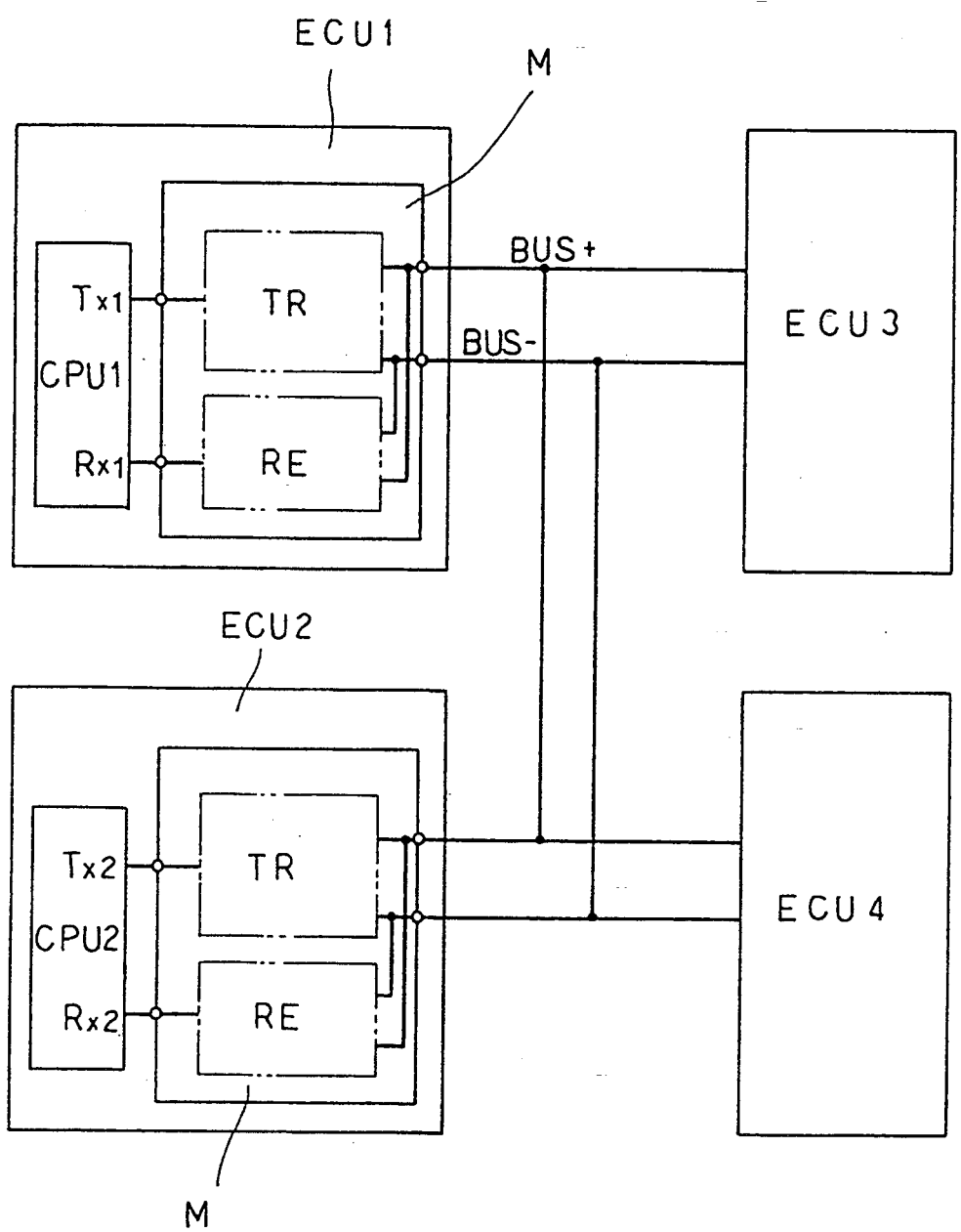
FIG. 1 is a block diagram of the entire structure of a multiplex transmission system to which the preset. invention is applied.

FIG. 1 is a block diagram of a multiplex transmission system according to a first embodiment of the present invention. In FIG. 1, ECU 1 to ECU4 are mutually connected by two transmission lines BUS+ and BUS− of parallel pair wires. Each ECU comprises a CPU and a common transmitting and receiving circuit (M Section). Tx is a CPU transmitting section. Rx is a CPU receiving section. TR is a transmitting circuit. RE is a receiving circuit.

Figure 2:
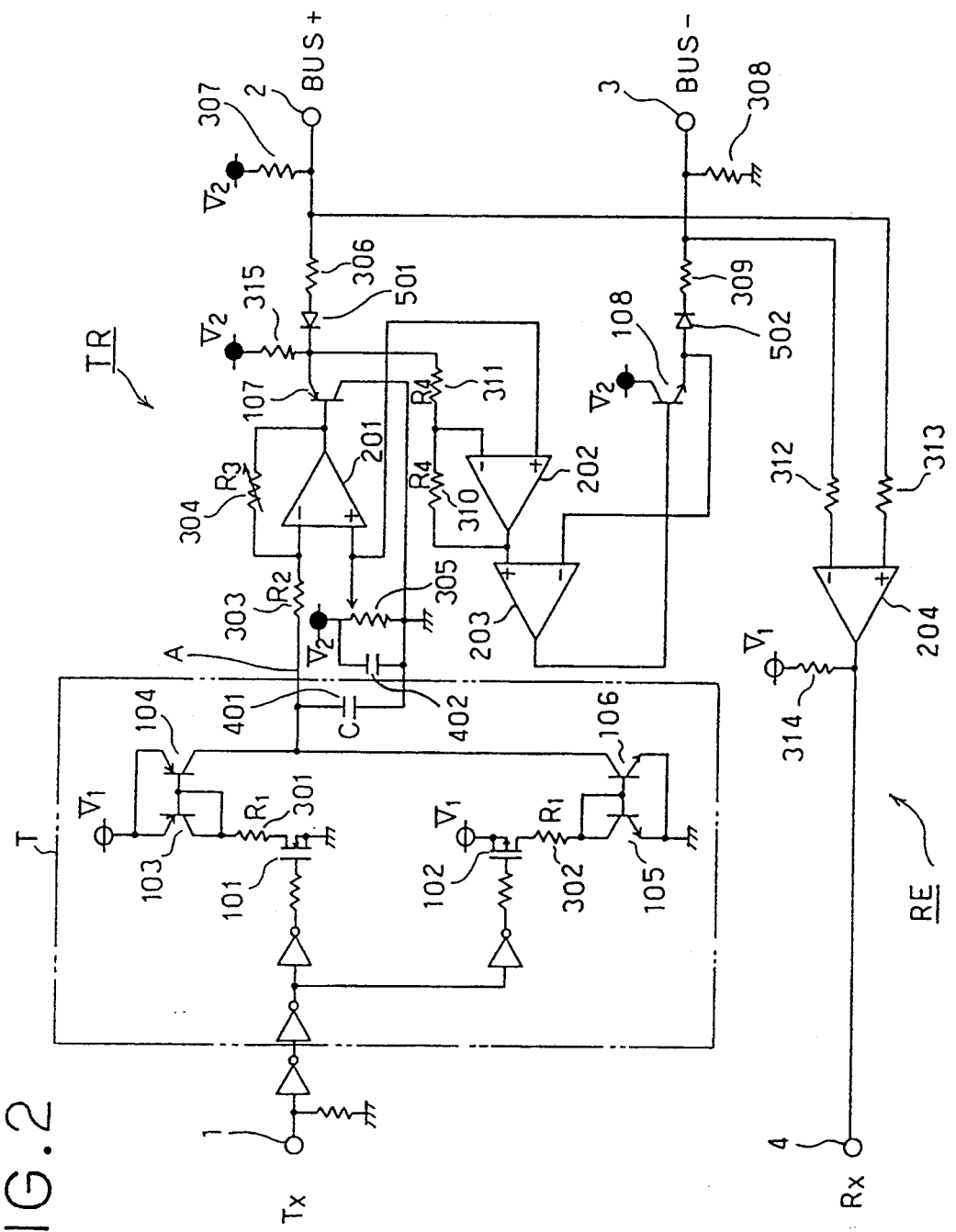
FIG. 2 is an embodied circuit structure of the transmitting receiving circuits according to a first embodiment of the present invention.

FIG. 2 shows an embodied circuit structure of the transmitting and receiving circuit M of FIG. 1.

In FIG. 2, reference numeral 1 denotes an input terminal for inputting a square wave signal sent from transmitting section Tx of CPU.

2 is an output terminal for outputting an output signal shaped into a trapezoidal wave on the basis of a square wave signal on transmission line BUS+.

3 is an output terminal for outputting an output signal having a polarity which is inverted relative to the above described trapezoidal wave signal, and which signal is output onto transmission line BUS−.

4 is a receiving output terminal for inputting a demodulated square wave signal, previously two trapezoidal wave signals input from transmission lines BUS+ and BUS−, the demodulated signal being fed to receiving section Rx of CPU.

T is a trapezoidal wave shaping circuit for shaping a square wave signal, received from transmitting section Tx, into a trapezoidal wave.

101 and 102 denote FETs for driving a current mirror circuit. 103 to 106 are transistors forming a current mirror circuit. 107 and 108 are transistors for driving transmission lines. 201 is an operational amplifier for adjusting BUS+ output signal level. 202 is an operational amplifier for providing polarity inversion. 203 is an operational amplifier providing signal feedback. 204 is a comparator serving as a receiver.

301 and 302 denote resistors for determining the current of a current mirror circuit, each having a resistance value R1. 303 and 304 are resistors for adjusting BUS+ output signal amplitude level, each having resistance values R2, R3, respectively. 305 is a resistor for adjusting BUS+ output signal DC offset level. 306 and 309 are resistors for protecting a transistor driving the transmission lines. 307 and 308 are resistors for biasing the transmission lines BUS+ and BUS−. 310 and 311 are resistors for inverting the BUS+ signal, each having a resistance value R4. 312 and 313 are resistors for protecting a receiver. 314 is a resistor for pulling up a comparator output. 315 is a resistor for setting a BUS+ signal level.

401 denotes a capacitor for setting a transmission time of the BUS+ signal, having a capacitance value C. 402 is a capacitor for providing noise elimination.

501 denotes a diode for protecting a reverse surge and serves to disable operation of BUS− when a signal is sent to BUS+ from the other ECU. 502 is a diode for protecting reverse surge.

Circuit operation of FIG. 2 is explained hereunder. First, in the TR section, a square wave signal conveying transmitting information from transmitting section Tx of CPU is input to input terminal 1.

When an input signal is in a logic "H" level the signal to be applied to the gate of FET 101 becomes logic "L" level causing FET 101 to turn OFF because it is an N-channel type transistor.

Consequently, transistor 103 and transistor 104, which form a current mirror circuit, turn OFF and current does not flow through transistor 104.

Meanwhile, FET 102 is ON and a constant current, V1/R1, flows into transistor 105 by way of resistor 302. This constant current also flows into a collector of transistor 106 which forms a current mirror circuit with transistor 105.

If capacitor 401 is charged, it becomes discharged due to the constant current flowing through transistor 106. In turn, potential VA, at point A, drops linearly to almost a GND potential.

Conversely, when a signal input to the input terminal 1 is logic "L" level, FET 101 turns ON and a constant current, V1/R1, flows into current mirror transistors 103, 104 by way of resistor 301.

At this time, FET 102 is OFF and current does not flow into transistors 105, 106. If capacitor 401 is not charged, it becomes charged as the potential VA, at point A, linearly rises to about V1. Because di/dt=CV and i is expressed by V1/R1 and is constant, the rising or falling gradient V/t also becomes constant.

In connection with trapezoidal wave shaping circuit T, a square wave signal input at input terminal 1 is modulated into a trapezoidal wave signal. In turn, a trapezoidal wave signal appears at point A.

This trapezoidal wave signal is supplied to the negative (−) terminal of operational amplifier 201. A voltage VOS, preset by resistor 305, is also supplied to the positive (+) terminal of operational amplifier 201.

The voltage VB supplied to the base of transistor 107 is expressed as follows.

$$VB = VOS - (R3/R2)(VA - VOS)$$

As will be understood from this equation, a base potential of transistor 107 varies with the amplitude of (R3/R2)V1 and with a change in potential VA, at point A, on the basis of preset potential VOS. This amplitude at the base potential can be lowered by as much as the amplitude of potential VA, at point A, when equal to a GND potential level.

Capacitor 402 is provided for eliminating noise. An output of operational amplifier 201 is input to the base of transistor 107. When a base potential of transistor 107 is lowered linearly, an emitter potential is higher by as much as VBE, than a base potential thereof, and is therefore also lowered linearly relative to the base potential.

Conversely, when the base potential increases, an emitter potential is higher, by as much as VBE than the base potential thereof, and therefore also increases linearly relative to the base potential.

Consequently, a signal having a potential which is set higher, by as much as a voltage drop (caused by diode 501 and resistor 306) from the emitter potential, is transmitted to transmission line BUS+ from output terminal 2.

Similarly, an emitter potential of transistor 107 is input to the negative (−) terminal of operational amplifier 202 through resistor 311.

A potential VOS, set by resistor 305, is input to the positive (+) terminal of operational amplifier 202, as it was input to the positive (+) terminal of operational amplifier 201.

When the resistance value of resistors 310 and 311 is R4, the output of operational amplifier 202 can be expressed by the following equation, the emitter potential of transistor 107 being VE.

$$VOS - (VE - VOS) = 2VOS - VE$$

The output voltage has an inverted level of the emitter potential VE relative to the presetting potential VOS. An output of operational amplifier 202 is input to the base of transistor 108 through operational amplifier 203.

When an emitter potential VE of transistor 107 is lowered linearly, the base potential at transistor 108 increases linearly and, in turn, the emitter potential of transistor 108 increases linearly in response to the increase of the base potential but maintained at a potential lower, by as much as VBE, than the base potential.

Conversely, when the emitter potential VE of transistor 107 increases linearly, The base potential at transistor 108 lowers linearly and, in turn, the emitter potential of transistor 108 is linearly lowered by as much as VBE, relative to the base potential.

Operational amplifier 203 operates as a voltage follower and controls the base potential of transistor 108 using the output potential of operational amplifier 202 so that the inverted emitter potential of transistor 107 becomes equal to the emitter potential of transistor 108.

Accordingly, a signal having a potential which is lowered, by a voltage drop caused by diode 502 and resistor 309, from the emitter potential of transistor 108, is transmitted to transmission line BUS− from output terminal 3. Therefore, as will be obvious from the operations explained above, communication signals transmitted to transmission lines BUS+ and BUS−, respectively, are in phase but have opposite polarity waveforms, with equal amplitude, using preset voltage VOS as a reference.

With regard to section RE, the positive (+) terminal of comparator 204 is connected to transmission line BUS+ through potential resistor 313. The negative (−) terminal of comparator 204 is connected to transmission line BUS− through protection resistor 312.

Comparator 204 outputs a logic "H" level when a signal potential at the positive (+) terminal is higher than a signal potential at the negative (−) potential, and a logic "L" level when the relationship is reversed. The comparator outputs define signal levels to receiving output terminal 4.

Above operations will then be explained in a system where data is transmitted from ECU 1 to ECU 2, and received, from ECU 2, by ECU 1. First, a square wave signal is transmitted from Tx 1 of CPU 1, then modulated to a trapezoidal waveform by the TR section of the transmitting and receiving circuit M within ECU 1 and transmitted to transmission line BUS+.

An inverted signal is then shaped from the modulated signal waveform, now a trapezoidal waveform, and transmitted to another transmission line BUS−. Each output data is then input to ECU 2, demodulated to a square wave signal by a comparator circuit in the RE section of the M section within ECU 2, and then input to Rx 2 of CPU 2, at which time, is received by CPU 2.

In this manner, each ECU, shown in FIG. 1, is capable of operating under mutual transmission and reception in accordance with a predetermined protocol (transmission regulation).

As shown in FIG. 2, only one trapezoidal waveform shaping circuit is provided in a first embodiment explained above. A voltage feedback output is used to form an output trapezoidal waveform which is transmitted to a second transmission line from a first trapezoidal waveform transmission line.

Accordingly, an inverted output waveform is generated of extremely accurate polarity inverted waveform characteristic relative to the non-inverted output waveform. As a result, generation of harmonics noise radiation from improper phase shift and time delay signal characteristics, during waveform transition, are avoided by the signal waveforms of the present embodiment, which signals are transmitted onto two-wire transmission lines, BUS+ and BUS−.

Moreover, because the emitter potentials of transistors 107 and 108 are input to the respective terminals of operational amplifier 203, to form an emitter follower circuit, even when there is a difference in the base-emitter voltage VBE of transistors 107, 108, an accurate polarity inverted waveform is output without influence by such voltage difference.

Moreover, diode 501 is inserted between transmission line BUS+ and transistor 107 such that the inverted signal waveform is generated from a signal transmitted onto transmission line BUS+ from the other ECU, disabling operation of the other transmission line BUS−. Diode 501 also operates to protect the circuit from reverse surge voltage.

A second embodiment shown in FIG. 3 will now be explained. As shown in FIG. 2, the aforementioned first embodiment shapes a signal waveform polarity is inverted by voltage feedback using operational amplifier 203. This second embodiment realizes current feedback.

Figure 3:
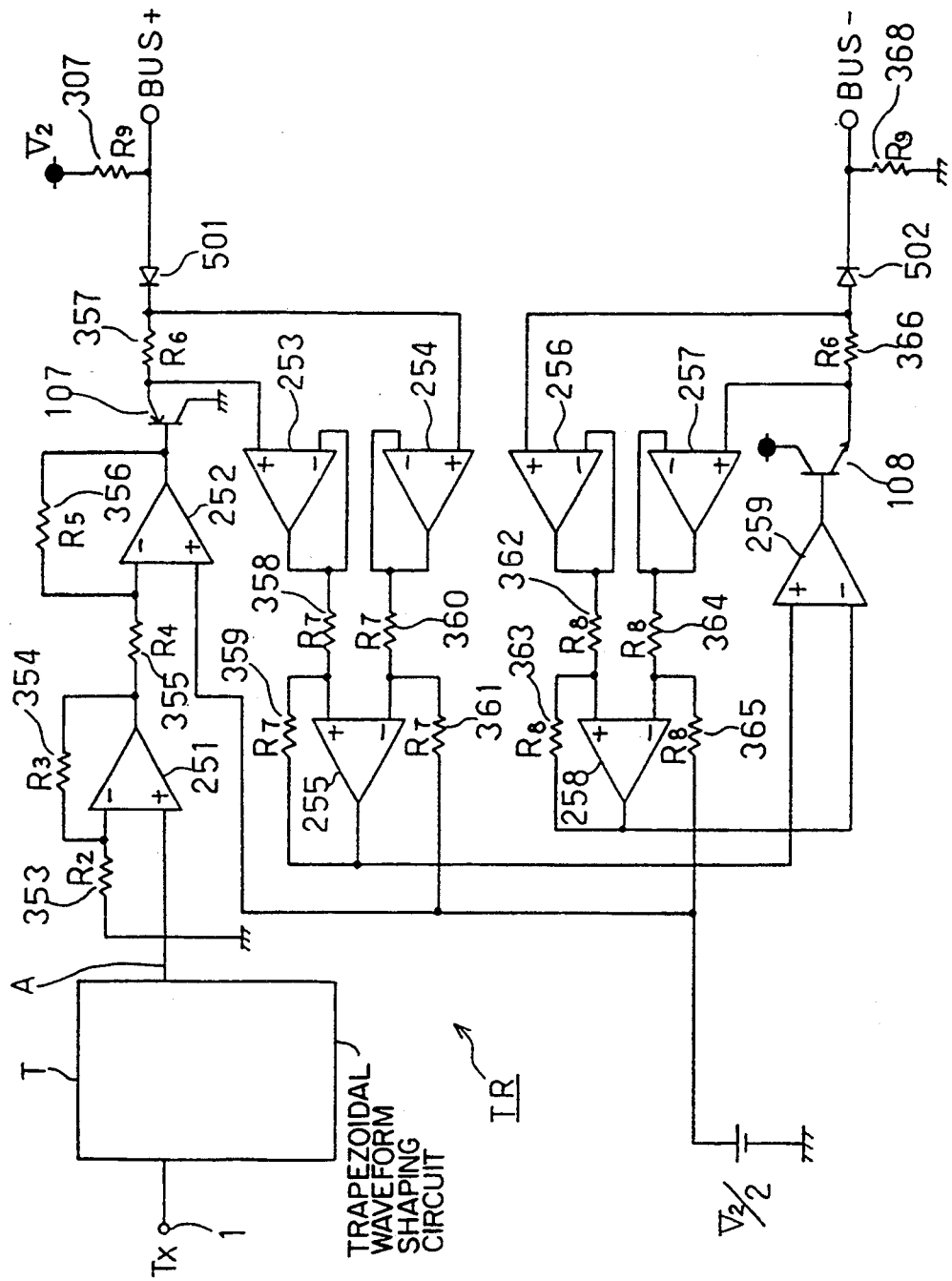
FIG. 3 is embodied circuit structure of the transmitting circuit according to a third embodiment.

In this second embodiment, receiving circuit (RE) is identical to the circuit shown in FIG. 2, only transmitting circuit (TR) of M section is different, and is shown in FIG. 3.

In FIG. 3, equivalent elements as those in FIG. 2 are defined by the same reference numerals. In this FIG. 3, reference numeral 251 denotes an operational amplifier for amplifying BUS+ output signal voltage level (amplitude). 252 is an operational amplifier for adjusting BUS+ output signal level. 253, 254, 256 and 257 are operational amplifiers which form a voltage follower. 255 is an operational amplifier for differentially amplifying a voltage across a BUS+ monitor resistor 357. 258 is an operational amplifier for differentially amplifying a voltage across a BUS− monitor resistor 357. 259 is an operational amplifier for feedback.

353 and 354 denote resistors for amplifying BUS+ output signal voltage level (amplitude), having resistance values R2, R3. 355 and 356 are resistors for adjusting BUS+ output signal level, having resistance values R4, R5. 357 is a resistor for BUS+ output current monitor having a resistance value R6. 358 to 361 are resistors for differentially amplifying a voltage across resistor 357 and having an equal resistance value R7. 362 to 365 are resistors for differentially amplifying a voltage across resistor 366, having an equal resistance value R8. 366 is a resistor for BUS− output current monitor having a resistance value R6. 367 and 368 are resistors for BUS− bias, having an equal resistance value R9.

Operations of the second embodiment shown in FIG. 3 will now be explained. First, a square wave signal input to input terminal 1 is modulated to a corresponding trapezoidal wave signal by trapezoidal waveform shaping circuit T just like in the first embodiment. A trapezoidal wave signal thus appears at point A.

In turn, a trapezoidal wave signal having an amplitude of almost V1 is input to the positive (+) terminal of operational amplifier 251.

Operational amplifier 251 operates on a voltage V2 (>V1). A trapezoidal wave signal with amplitude of about V2 is output to the output terminal of operational amplifier 251 and is then input to the negative (−) terminal of operational amplifier 252 through resistor 355 by setting resistors 353 and 354 such that the relation R3=(V2/V1 −1)R2 is obtained.

Moreover, a potential V2/2 is applied to the positive (+) terminal of operational amplifier 252. Accordingly, a voltage at the base of transistor 157, namely a base potential of transistor 107, changes in amplitude (R5/R4)V2, in accordance with a change of the potential VA appearing at point A, to around a potential V2/2 to be applied to the positive (+) terminal.

Consequently, a voltage which is higher, by as much as VBE, than the base potential appears at the emitter of transistor 107.

BUS+ bias resistor 307 has a resistance value R9 but a coupled ECU also has a similar resistance value. Therefore, when total of N ECU units are connected, a combined resistance value becomes equal to R9/N.

Accordingly, when an emitter voltage appearing at the emitter of transistor 107 is VE, a current IE expressed by (V2−VE−Vf)/(R6+R9/N)=IE flows into resistor 357 and a voltage difference of R6•IE is generated across resistor 357 (where Vf is a forward voltage of diode 551). A voltage signal level VBUS+ of BUS+ is expressed as $$VBUS+ = VE + R6 \cdot IE + Vf$$

Thereby, a trapezoidal wave signal which is higher, by a voltage drop caused by diode 501 and resistor 357, from the emitter potential of transistor 107, is transmitted to transmission line BUS+ from output terminal 2.

In addition, operational amplifiers 253 and 254 form a voltage follower such that a current which is equal to a drive current of transistor 157 flows into monitor resistor 357. Therefore, in FIG. 3, the right side potential of resistors 358, 360 becomes equal to VE, VE+IE•R6, respectively.

Therefore, a potential to be applied to the negative (−) terminal of operational amplifier 255 becomes equal to the potential obtained by dividing the potential V2/2 and VE+IE•R6 with the resistors 306 and 361, namely to a potential of (VE+IE•R6+V2/2)/2. The positive (+) terminal also has an equal potential. Accordingly, since resistors 358 and 359 have equal resistance value R7, an output potential operational amplifier 255 is indicated as $$2\{(VE+IER6+V2/2)/2\} - VE = IER6+V2/2.$$

This output potential becomes an input of the positive (+) terminal of the operational amplifier 259. Meanwhile, when a current flowing to the monitor resistor 366 is defined as IE′ and a number of ECUs to be connected is set to N, an emitter potential VE′ of the transistor 108 is expressed as follows.

$$VE' = IE'(R6+R9N) + Vf$$

Therefore, an anode potential of diode 502 is expressed by VE′−IE′ R6 and it is applied to the positive (+) terminal of operational amplifier 256. Moreover, a potential VE′ is applied to the positive (+) terminal of operational amplifier 257.

Operational amplifiers 256 and 257 receive a voltage across monitor resistor 366 with each voltage follower circuit so that a current which is equal to the drive current of transistor 108 flows to monitor resistor 366 just as in the BUS+ side. For this reason, an output voltage of the monitor resistor 366 becomes equal to VE′−IE′•R6 and an output potential of operational amplifier 257 becomes equal to VE′.

Since a voltage at the negative (−) terminal of operational amplifier 258 is divided by resistors 364 and 365, an input potential thereof becomes equal to (VE′+V2/2)/2.

Consequently, a potential at the positive (+) terminal of operational amplifier 258 also becomes equal to (VE′+V2/2)/2 and because resistors 362 and 363 have a resistance value R8, an output potential becomes equal to $$2\{(VE, +V/2)/2\} - (VE' - IE \cdot R6) = IE \cdot R6 + V2/2$$

This output potential becomes an input to the negative (−) terminal of operational amplifier 259.

Here, operational amplifier 259 controls a base potential of transistor 108 so that the output voltages of operational amplifiers 255 and 258 become equal.

The following relationships are thus established.

$$IER6 + V2/2 = IE'R6 + V2/2$$

$$IE = IE'$$

Thereby, the drive currents of transistors 107, 108 for driving two transmission lines BUS+, BUS− become equal to each other.

Because the currents flowing into transmission lines BUS+ and BUS— are reversed in relation to each other, in the flowing direction, a signal voltage level transmitted from output terminal 3 and flows into transmission line BUS— is set so as to become an extremely accurate polarity inverted waveform of the output waveform of the other BUS+, since IE=IE'.

As a result, generation of harmonics noise radiation is avoided as in the circuit of the first embodiment.

The second embodiment, utilizing current feed back, eliminates the influence of fluctuation, for example, GND fluctuation of the signal level, particularly of signal level of BUS— in the grounding side. Hence, this embodiment is especially suitable as the apparatus to be mounted on a vehicle wherein GND level easily changes due to driving by an actuator.

A third embodiment shown in FIG. 4 will now be explained. This third embodiment is also of the current feed back type, like the second embodiment explained above, wherein the direction of the currents flowing into the transmission lines BUS+, BUS— is reversed. Since the receiving circuit of this third embodiment is identical to that shown in FIG. 2, only the transmitting circuit (TR) of M section need be shown in FIG. 4.

Figure 4:
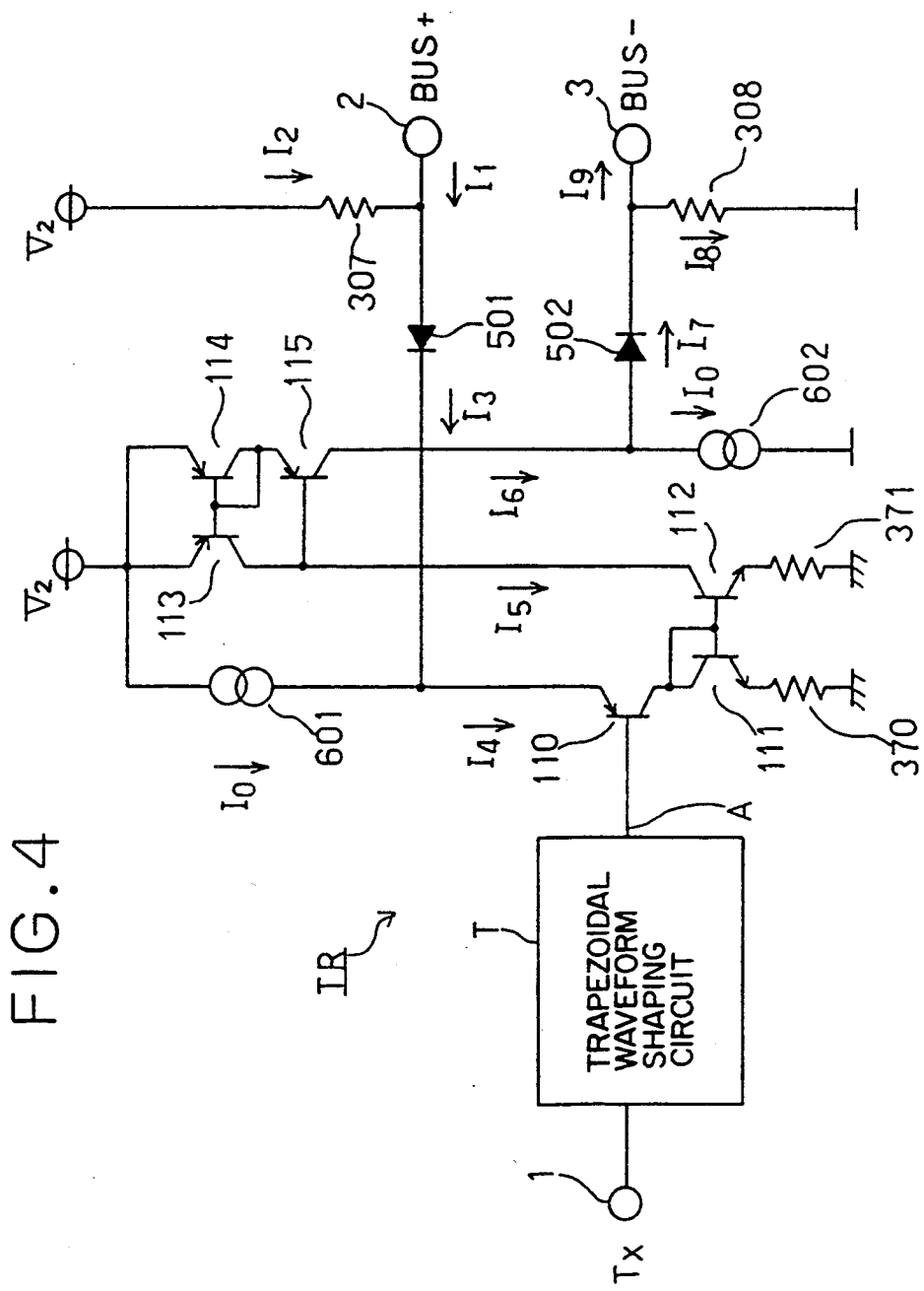
FIG. 4 is an embodied circuit structure of the transmitting circuit according to a third embodiment.

In FIG. 4, equivalent elements as those shown in FIG. 2 and FIG. 3 are denoted by the same reference numerals.

In FIG. 4, reference numeral 110 denotes a transistor for driving transmission lines. 111 to 115 are transistors to form a current mirror circuit. 601 and 602 are constant current circuits for improving the response characteristic of the circuit. 370 and 371 are compensation resistors of a current mirror circuit.

Operations of the structure explained above will be explained hereunder. First, a square wave signal input to input terminal 1 is modulated to a corresponding trapezoidal wave signal, like in the case of the first embodiment, using trapezoidal waveform shaping circuit T. This trapezoidal wave signal appears at point A.

This trapezoidal wave signal is then applied to the base of transistor 110. When a base potential of transistor 110 is lowered linearly, an emitter potential is higher, by as much as VBE, than the base potential and is also linearly lowered in line with the base potential.

When the base potential increases, the emitter potential is higher, by as much as VBE, than the base potential, and linearly increases in line with the base potential.

Consequently, a signal which is higher by a voltage drop, caused by diode 501, from the emitter potential, is transmitted to transmission line BUS+ from output terminal 2.

A current, almost equal to a collector current of transistor 110, flows as a collector current of transistor 115 by way of a first current mirror circuit comprising transistors 111, 112 and resistors 370, 371 and a second current mirror circuit comprising transistors 113 to 115.

Constant currents generated by constant current circuits 601 and 602 are set equal to each other. The resistance values of resistors 370 and 371 are also set equal to each other.

In addition, like the second embodiment explained above, it is assumed that the other ECUs will have a resistance value which is equal to BUS+ bias resistance 307 with a total of N ECU units are connected.

In this manner, when a constant current of constant current circuits 601 and 602 is defined as I0, a signal current of BUS+ as I1, a current flowing into resistor 307 as I2, a current flowing into diode 501 as I3, an emitter current of transistor 110 as I4, a collector current of transistor 112 as I5, a collector current of transistor 115 as I6, a current flowing into diode 502 as I7, a current flowing into resistor 308 as I8 and a signal current of BUS— as I9, the following relationships are obtained.

$$I1+I2=I3,\ I0+I3=I4,\ I4 \approx I5 \approx I6,\ I6=I0+I7,$$
$$I7=I9+I8,\ I1=(N-1)\times I2,\ I9=(N-1)\times I8$$

By solving these relationships, $I1 \approx I9$. Namely, a current transmitted to the transmission line BUS— can be generated from a collector current of transistor 111 through a couple of current mirror circuits. Therefore, a current flowing into BUS— can be set equal to the current flowing to BUS+ as in the second embodiment.

As a multiplex transmission system in the above embodiments, a system forming a transmitting circuit and a receiving circuit in each ECU for mutual transmission and reception between these circuits is presented as shown in FIG. 1.

Figure 5:
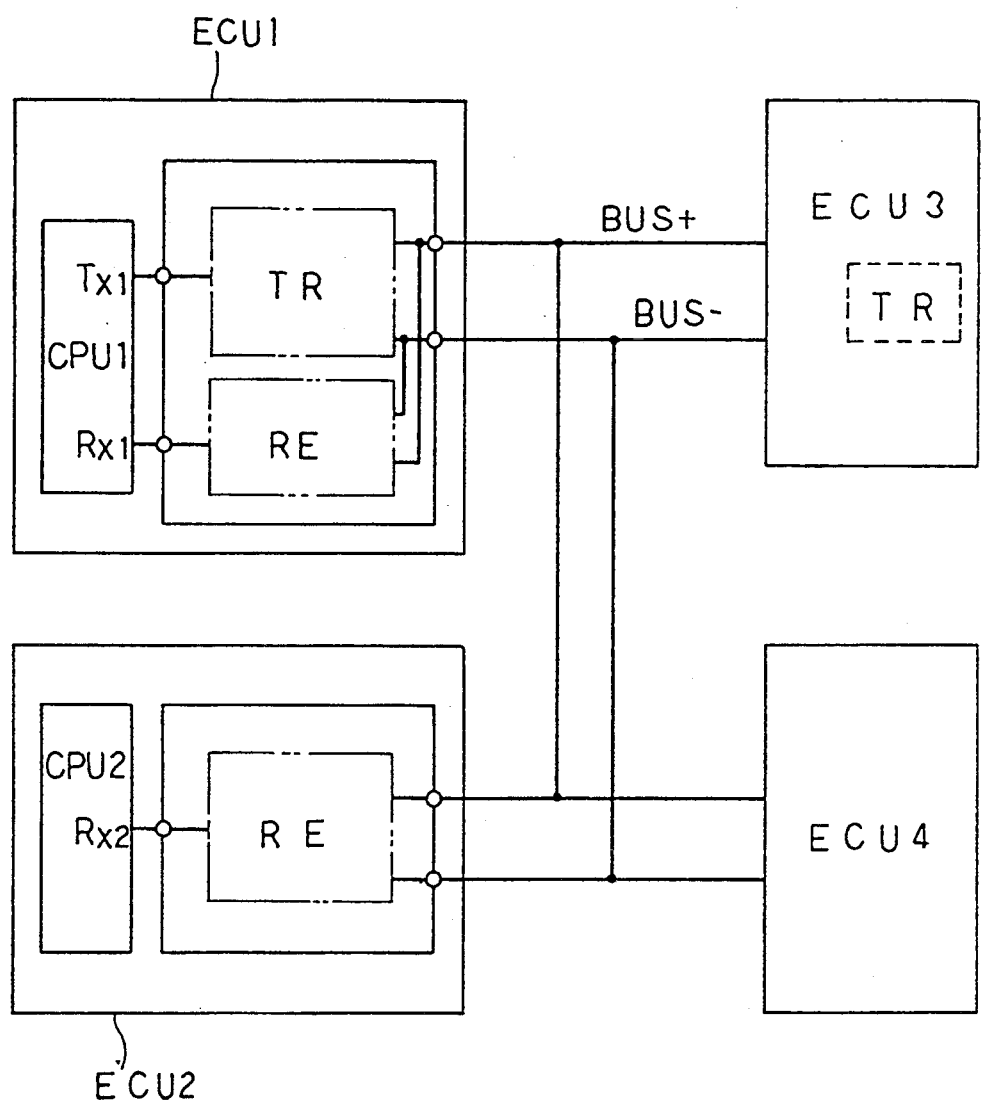
FIG. 5 a block diagram of the entire structure of another multiplex transmission system.

However, it is also possible, as shown in FIG. 5, for an ECU I to comprise a transmitting circuit and a receiving circuit, acting as a center station, and for remaining ECUs 2 to 4 to include only one of the receiving circuit and the transmitting circuit, and to act as peripheral stations.

Moreover, any type of transmission system may be employed so long as it is based on a balanced two-wire system. For example, a twisted-pair system can also be employed as well as the parallel pair-wire as indicated in the embodiments explained above.

Moreover, in any embodiment explained above, a square wave signal is modulated into a trapezoidal wave signal by a trapezoidal waveform shaping circuit T, but it is also allowed to apply the present invention to a system where a square wave signal is transmitted without being modulated into a trapezoidal wave signal.

Figure 6:
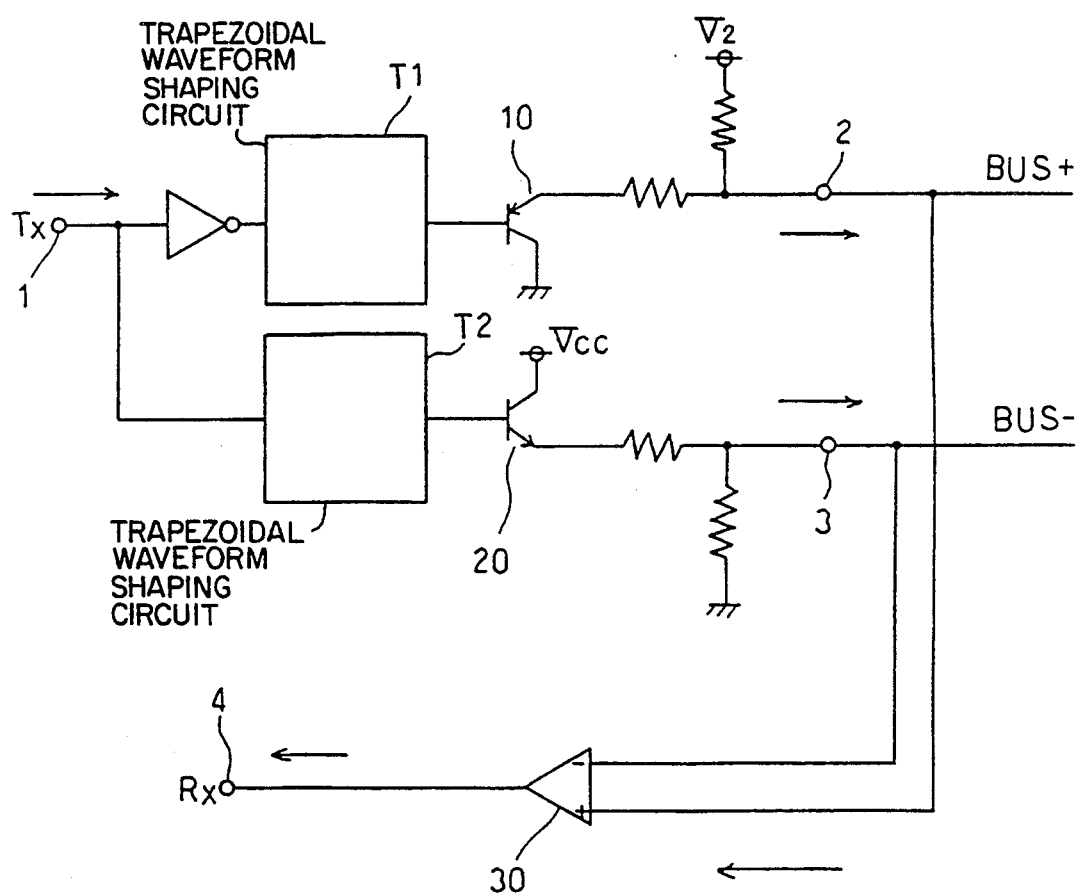
FIG. 6 is a circuit structure of an early design by the inventors of the present invention.

FIG. 6 illustrates a less complicated embodiment reflecting inventors' early work in this invention.

In this circuit, a square wave signal input to input terminal 1, from transmission Tx, is branched to two routes. Each of two square wave signals is then respectively processed by trapezoidal wave shaping circuits T1, T2.

One signal waveform is converted to an inverse of the other signal and then both transmitted to different transmission of a balanced two-wire system, via output terminals 2, 3.

The amplitude of the two signal waveforms is compared using comparator 30, at a receiving side, and the signals demodulated into a square waveform with the purpose of suppressing modulation and demodulation errors as much as possible.

While the circuit of FIG. 6 reduces modulation and demodulation errors, it allows for adverse effects resulting from harmonics radiation at intermediate transmission rates close to 100 kbps.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A communication apparatus for transmitting and receiving a communication signal by connecting a first control circuit comprising at least a transmitting circuit and a second control circuit comprising at least a receiving circuit with common transmission line means, wherein:

said common transmission line means comprises a first transmission line and a second transmission line;

said transmitting circuit comprises:

first transmitting means for inputting a square wave data signal;

means for converting the square wave data signal at the rising and falling edges thereof into the signal wave of predetermined non-infinite slope gradient;

means for transmitting the signal wave, corresponding to a communication signal, to said first transmission line;

voltage driving means for driving and controlling a first voltage on said first transmission line which transmits said communication signal;

second transmitting means for inputting said communication signal and generating a polarity inverted signal of said communication signal transmitted from said first transmission line; and means for transmitting said polarity inverted signal to said second transmission line as a second voltage;

a feedback circuit, receiving said first voltage, for controlling a voltage level of said second voltage based on said first voltage and, wherein said receiving circuit comprises means for comparing amplitudes of each said communication signal and said polarity inverted signal transmitted from said transmitting circuit via said first and second transmission lines to demodulate the compared signals into the square wave data signal.

2. A communication apparatus according to claim 1, wherein said second transmitting means comprises current control means for controlling a current such that a current flowing into said first transmission line during transmission of said communication signal onto said first transmission line and such that a current flowing into said second transmission line during transmission of said polarity inverted signal onto said second transmission line, are equal in amplitude but opposite in polarity and travelling in a direction defined by the signal transmitting direction toward said first and second transmission lines.

3. A communication apparatus for transmitting and receiving a communication signal by connecting a first control circuit comprising at least a transmitting circuit and a second control circuit comprising at least a receiving circuit with common transmission line means, wherein:

said common transmission line means comprises a first and a second transmission lines;

said transmitting circuit comprises:

first transmitting means for inputting a square wave data signal:

means for converting the square wave data signal at the rising and falling edges thereof into a signal wave of predetermined gradient;

means for transmitting the signal wave, corresponding to a communication signal, to said first transmission line;

second transmitting means for inputting said communication signal and generating a polarity inverted signal of said communication signal transmitted from said first transmission line: and means for transmitting said polarity inverted signal to said second transmission line: wherein said receiving circuit comprises means for comparing amplitudes of each said communication signal and said polarity inverted signal transmitted from said transmitting circuit via said first and second transmission lines to demodulate the compared signals into the square wave data signal; and, wherein said second transmitting means includes means for controlling current comprising:

first current detecting means for detecting a current flowing into said first transmission line;

second current detecting means for detecting a current flowing into said second transmission line; and control means for controlling a current flowing into said second transmission line such that the currents detected by said first and second current detecting means are equal in amplitude but opposite in polarity and travelling in the direction defined by the signal transmitting direction toward said first and second transmission lines.

4. A communication apparatus for transmitting and receiving a communication signal by connecting a first control circuit comprising at least a transmitting circuit and a second control circuit comprising at least a receiving circuit with common transmission line means. wherein:

said common transmission line means comprises a first and a second transmission line;

said transmitting circuit comprises:

first transmitting means for inputting a square wave data signal;

means for converting the square wave data signal at the rising and falling edges thereof into a signal wave of predetermined gradient;

means for transmitting the signal wave, corresponding to a communication signal, to said first transmission line;

voltage driving means for driving a voltage on said first transmission line to transmit said communication signal thereto;

second transmitting means for inputting said communication signal and generating a polarity inverted signal of said communication signal transmitted from said first transmission line; and means for transmitting said polarity inverted signal to said second transmission line; wherein said receiving circuit comprises means for comparing amplitudes of each said communication signal and said polarity inverted signal transmitted from said transmitting circuit via said first and second transmission lines to demodulate the compared signals into the square wave data signal;

said second transmitting means comprises current control means for controlling a current such that a current flowing into said first transmission line during transmission of said communication signal onto said first transmission line and such that a current flowing into said second transmission line during transmission of said polarity inverted signal onto said second transmission line, are equal in amplitude but opposite in polarity and travelling in a direction defined by the signal transmitting direction toward said first and second transmission lines; and wherein said current control means comprises means for extracting a current flowing into said first transmission line through a current mirror circuit and controlling a current flowing into said second transmission line, based on the extracted current, such that each of these currents are equal in amplitude but opposite in polarity and travelling in a direction defined by the signal transmitting direction toward said first and second transmission lines.

5. A communication apparatus according to claim 1, wherein said voltage driving means comprises one-way signal enabling means for enabling transmission of said communication signal onto said first transmission line while preventing said second transmitting means from operating in error by receiving unwanted signals from said first transmission line.

6. A communication apparatus according to claim 1, wherein each of said first and second control circuits comprise both a transmitting circuit and a receiving circuit for mutual transmission and reception of signals.

7. A communication apparatus according to claim 1, wherein said first control circuit also includes a receiving circuit, while said second control circuit comprises only a receiving circuit to receive a communication signal from said first control circuit and further includes a transmitting means, different from said transmitting circuit, for transmitting communication signals to said first control circuit.

8. A communication apparatus for transmitting and receiving a communication signal by connecting a first control circuit comprising at least a transmitting circuit and a second control circuit comprising at least a receiving circuit, with common transmission line means, wherein said common transmission line means comprises a first transmission line and a second transmission line;

said transmitting circuit comprises:

first transmitting means for converting received communication information into a communication signal to transmit to said first transmission line;

voltage driving means for driving and controlling a first voltage on said first transmission line which transmits said first communication signal thereto;

second transmitting means for inputting said communication signal and generating a polarity inverted signal of said communication signal transmitted from said first transmission line;

means for transmitting said polarity inverted signal to said second transmission line as a second voltage; and feedback circuit, receiving said first voltage, for controlling a voltage level of said second voltage based on said first voltage and, wherein said receiving circuit comprises means for comparing amplitudes of each said communication signal and said polarity inverted signal transmitted from said transmitting circuit via said first and second transmission lines to demodulate the compared signals into the originally received communication information.

9. A communication apparatus according to claim 8, wherein said second transmitting means comprises current control means for controlling a current such that a current flowing into said first transmission line during transmission of said communication signal onto said first transmission line and such that a current flowing into said second transmission line during transmission of said polarity inverted signal onto said second transmission line, are equal in amplitude but opposite in polarity and travelling in a direction defined by the signal transmitting direction toward said first and second transmission lines.

10. A communication apparatus according to claim 8, wherein said voltage driving means comprises one-way signal enabling means for enabling transmission of said communication signal onto said first transmission line while preventing said second transmitting means from operating in error by receiving unwanted signals from said first transmission line.

11. A communication apparatus according to claim 8, wherein each of said first and second control circuits comprise both a transmitting circuit and a receiving circuit for mutual transmission and reception of signals.

12. A communication apparatus according to claim 8, wherein said first control circuit also includes a receiving circuit, while said second control circuit comprises only a receiving circuit to receive a communication signal from said first control circuit and further includes a transmitting means, which is different from said transmitting circuit, for transmitting communication signals to said first control circuit.

13. A communication apparatus for transmitting and receiving a communication signal by connecting a first control circuit comprising at least a transmitting circuit and a second control circuit comprising at least a receiving circuit with common transmission line means, wherein:

said common transmission line means comprises a first and a second transmission lines;

said transmitting circuit comprises;

first transmitting means for converting received communication information into a communication signal to transmit to said first transmission line;

second transmitting means for inputting said communication signal and generating a polarity inverted signal of said communication signal transmitted from said first transmission line; and means for transmitting said polarity inverted signal to said second transmission line; wherein said receiving circuit comprises means for comparing amplitudes of each said communication signal and said polarity inverted signal transmitted from said transmitting circuit via said first and second transmission lines to demodulate the compared signals into the originally received communication information; and, wherein said second transmitting means includes means for controlling current comprising:

first current detecting means for detecting a current flowing into said first transmission line;

second current detecting means for detecting a current flowing into said second transmission line; and control means for controlling a current flowing into said second transmission line such that the currents detected by said first and second current detecting means are equal in amplitude but opposite in polarity and travelling in the direction defined by the signal transmitting direction toward said first and second transmission lines.

14. A communication apparatus for transmitting and receiving a communication signal by connecting a first control circuit comprising at least a transmitting circuit and a second control circuit comprising at least a receiving circuit with common transmission line means, wherein:

said common transmission line means comprises a first and a second transmission lines;

said transmitting circuit comprises:

first transmitting means for converting received communication information into a communication signal to transmit to said first transmission line;

voltage driving means for driving a voltage on said first transmission line to transmit said first communication signal thereto;

second transmitting means for inputting said communication signal and generating a polarity inverted signal of said communication signal transmitted from said first transmission line; and means for transmitting said polarity inverted signal to said second transmission line; wherein said receiving circuit comprises means for comparing amplitudes of each said communication signal and said polarity inverted signal transmitted from said transmitting circuit via said first and second transmission lines to demodulate the compared signals into the originally received communication information;

said second transmitting means comprises current control means for controlling a current such that a current flowing into said first transmission line during transmission of said communication signal onto said first transmission line and such that a current flowing into said second transmission line during transmission of said polarity inverted signal onto said second transmission line, are equal in amplitude but opposite in polarity and travelling in a direction defined by the signal transmitting direction toward said first and second transmission lines, wherein said current control means comprises means for extracting a current flowing into said first transmission line through a current mirror circuit and controlling a current flowing into said second transmission line, based on the extracted current, such that each of these currents are equal in amplitude but opposite in polarity and travelling in a direction defined by the signal transmitting direction toward said first and second transmission lines.

* * * * *